(12) United States Patent
Xu

(10) Patent No.: US 8,267,388 B2
(45) Date of Patent: Sep. 18, 2012

(54) ALIGNMENT ASSEMBLY

(75) Inventor: Ying Xu, San Ramon, CA (US)

(73) Assignee: Xradia, Inc., Pleasanton, CA (US)

( * ) Notice: Subject to any disclaimer, the term of this patent is extended or adjusted under 35 U.S.C. 154(b) by 1360 days.

(21) Appl. No.: 11/853,901

(22) Filed: Sep. 12, 2007

(65) Prior Publication Data

US 2009/0067976 A1 Mar. 12, 2009

(51) Int. Cl.
| | |
|---|---|
| B23Q 3/18 | (2006.01) |
| B25B 1/10 | (2006.01) |
| B25B 5/10 | (2006.01) |
| B25B 5/00 | (2006.01) |
| B27B 5/18 | (2006.01) |
| B27B 27/06 | (2006.01) |
| B27B 3/28 | (2006.01) |
| B27B 27/04 | (2006.01) |
| B26D 1/18 | (2006.01) |
| H01L 21/68 | (2006.01) |

(52) U.S. Cl. ............ 269/60; 269/63; 269/64; 269/243; 269/246; 83/477.2; 83/471.3

(58) Field of Classification Search ............ 269/60, 269/37, 64, 63, 71, 243, 246; 83/471.3, 477.2, 83/435, 27; 403/381
See application file for complete search history.

(56) References Cited

U.S. PATENT DOCUMENTS

| | | | | | |
|---|---|---|---|---|---|
| 3,778,584 | A | * | 12/1973 | Fajt et al. | 219/101 |
| 3,899,028 | A | * | 8/1975 | Morris et al. | 172/4.5 |
| 3,924,122 | A | * | 12/1975 | Russell et al. | 250/236 |
| 4,070,012 | A | * | 1/1978 | La Rocco | 269/287 |
| 4,261,039 | A | * | 4/1981 | Baker et al. | 358/1.5 |
| 4,550,319 | A | * | 10/1985 | Ganssle et al. | 343/882 |
| 4,559,019 | A | * | 12/1985 | Fendley et al. | 445/67 |
| 4,610,739 | A | * | 9/1986 | Jensen | 156/64 |
| 4,630,374 | A | * | 12/1986 | Raleigh | 33/1 M |
| 4,678,976 | A | * | 7/1987 | Inoue | 318/577 |
| 4,854,990 | A | * | 8/1989 | David | 156/173 |
| 4,984,891 | A | * | 1/1991 | Miyazaki et al. | 356/500 |
| 5,066,131 | A | * | 11/1991 | Iwata et al. | 356/401 |
| 5,153,494 | A | * | 10/1992 | Hollis, Jr. | 318/640 |
| 5,172,160 | A | * | 12/1992 | Van Eijk et al. | 355/53 |
| 5,208,497 | A | * | 5/1993 | Ishii et al. | 310/12.01 |
| 5,325,578 | A | * | 7/1994 | Oetiker | 29/429 |
| 5,446,323 | A | * | 8/1995 | Neff et al. | 310/12.27 |
| 5,492,057 | A | * | 2/1996 | Bornhors et al. | 358/3.32 |
| 5,593,109 | A | * | 1/1997 | Williams | 244/3.21 |
| 5,623,853 | A | * | 4/1997 | Novak et al. | 74/490.09 |
| 5,714,756 | A | * | 2/1998 | Park et al. | 850/6 |

(Continued)

OTHER PUBLICATIONS

U.S. Appl. No. 11/764,486, filed Jun. 18, 2007.

*Primary Examiner* — Lee D Wilson
*Assistant Examiner* — Alvin Grant
(74) *Attorney, Agent, or Firm* — Houston & Associates, LLP

(57) ABSTRACT

Alignment assembly is used to center a sample on a moving stage system. The alignment assembly includes a pair of slides stacked on a stage with linear perpendicular movement relative to each other, and at least one actuator that is preferably physically separate from the linear slides and stage. The actuator(s) repeatedly extend an actuator arm to move the linear slides, and retract the arm for subsequent movement of the stage during and after the process of centering the sample in two dimensions on the stage. Either the stage system rotates, or multiple actuators are placed to move the alignment system in perpendicular directions relative to the stage, by repeatedly contacting only the top linear slide.

7 Claims, 5 Drawing Sheets

U.S. PATENT DOCUMENTS

| | | | | |
|---|---|---|---|---|
| 5,757,149 A * | 5/1998 | Sato et al. | | 318/135 |
| 5,760,564 A * | 6/1998 | Novak | | 318/687 |
| 5,805,375 A * | 9/1998 | Fan et al. | | 360/78.12 |
| 5,816,568 A * | 10/1998 | Fox | | 269/60 |
| 5,941,749 A * | 8/1999 | Brunetti et al. | | 445/63 |
| 5,974,007 A * | 10/1999 | Getreuer | | 369/30.16 |
| 6,003,229 A * | 12/1999 | Beduhn et al. | | 29/898.09 |
| 6,101,876 A * | 8/2000 | Brooks et al. | | 73/468 |
| 6,104,776 A | 8/2000 | Oikawa | | |
| 6,115,650 A * | 9/2000 | Demarest et al. | | 700/259 |
| 6,271,640 B1 * | 8/2001 | Lee | | 318/560 |
| 6,281,654 B1 * | 8/2001 | Lee | | 318/649 |
| 6,343,420 B1 * | 2/2002 | Beduhn et al. | | 29/898.07 |
| 6,369,972 B1 * | 4/2002 | Codilian et al. | | 360/78.04 |
| 6,538,348 B2 * | 3/2003 | Sawai et al. | | 310/12.06 |
| 6,688,202 B2 * | 2/2004 | Parks et al. | | 83/435.27 |
| 6,709,257 B2 * | 3/2004 | Foreman et al. | | 425/145 |
| 6,712,159 B2 * | 3/2004 | Estes et al. | | 175/40 |
| 6,712,347 B1 * | 3/2004 | Fredrickson et al. | | 269/37 |
| 6,813,543 B2 * | 11/2004 | Aalund et al. | | 700/245 |
| 6,840,752 B2 * | 1/2005 | Foreman et al. | | 425/174.4 |
| 6,926,094 B2 * | 8/2005 | Arntson et al. | | 173/32 |
| 6,932,558 B2 * | 8/2005 | Wu | | 414/757 |
| 6,944,944 B1 * | 9/2005 | Craythorn et al. | | 29/798 |
| 7,045,081 B2 * | 5/2006 | Foreman et al. | | 264/1.36 |
| 7,052,103 B2 * | 5/2006 | Silverbrook | | 347/19 |
| 7,052,262 B2 * | 5/2006 | Foreman et al. | | 425/145 |
| 7,054,750 B2 * | 5/2006 | Rodney et al. | | 702/9 |
| 7,057,162 B2 * | 6/2006 | Rentzsch | | 250/231.14 |
| 7,099,432 B2 | 8/2006 | Ichihara et al. | | |
| 7,126,107 B2 * | 10/2006 | Ahne et al. | | 250/231.13 |
| 7,172,119 B2 * | 2/2007 | Hall | | 235/400 |
| 7,193,493 B2 * | 3/2007 | Asano et al. | | 335/220 |
| 7,215,736 B1 | 5/2007 | Wang et al. | | |
| 7,312,845 B2 * | 12/2007 | Silverbrook | | 355/18 |
| 7,330,093 B2 * | 2/2008 | Asano et al. | | 335/220 |
| 7,387,008 B2 * | 6/2008 | Heffron et al. | | 72/110 |
| 7,490,769 B2 * | 2/2009 | Hall | | 235/400 |
| 7,505,125 B2 * | 3/2009 | Andrews et al. | | 356/237.2 |
| 7,535,193 B2 * | 5/2009 | Xu | | 318/649 |
| 7,663,271 B2 * | 2/2010 | Akieda et al. | | 310/12.31 |
| 8,027,027 B2 * | 9/2011 | Ebihara | | 355/72 |
| 2003/0015078 A1 * | 1/2003 | Taylor | | 83/437.2 |
| 2003/0068010 A1 | 4/2003 | Lentfer | | |
| 2005/0121844 A1 * | 6/2005 | Fredrickson et al. | | 269/37 |
| 2005/0212192 A1 * | 9/2005 | Fredrickson et al. | | 269/37 |
| 2005/0247177 A1 * | 11/2005 | Hetcher et al. | | 83/471.3 |
| 2005/0265814 A1 * | 12/2005 | Coady | | 414/744.5 |
| 2006/0162523 A1 * | 7/2006 | Hetcher et al. | | 83/471.3 |
| 2006/0266184 A1 * | 11/2006 | Hetcher et al. | | 83/471.3 |
| 2006/0294536 A1 * | 12/2006 | Braitberg et al. | | 720/736 |
| 2007/0102857 A1 * | 5/2007 | Fredrickson et al. | | 269/37 |
| 2007/0234864 A1 * | 10/2007 | Bettacchini | | 83/471.3 |
| 2008/0170089 A1 * | 7/2008 | Albertalli et al. | | 347/8 |
| 2008/0251983 A1 * | 10/2008 | Fredrickson et al. | | 269/45 |
| 2009/0067976 A1 * | 3/2009 | Xu | | 414/757 |

* cited by examiner

ALIGNMENT ASSEMBLY

BACKGROUND OF THE INVENTION

The ability of x rays to penetrate through material has been exploited extensively, such as in non-invasive and non-destructive imaging in medical and industrial applications. One example is computed tomography (CT), which relies on rotating the sample while collecting multiple images, or projections, with an x-ray transmission imaging instrument. Using applicable tomography algorithms, including the filtered backprojection, algebraic reconstruction technique (generally abbreviated as ART) and its derivatives, or the Fourier inversion techniques, a three dimensional image of the sample can be generated.

One specific application is failure analysis of integrated circuits and their packaging. Here, the penetrating power of x rays with tens to hundreds of kilo electron-Volts (keV) energy provides the ability to image internal structures of the ICs. These x-ray inspection tools typically provide resolutions on the order of tens of micrometers to nanometers.

In these CT applications, control over the position of the sample rotation axis is important to ensure that the region of interest of the sample is located within the field of view of the x-ray transmission imaging device and remains within the field of view throughout the full rotation range. For x-ray microscope imaging instruments, it is desirable that the rotation of a sample be accurate to within tens of nanometers in all three dimensions. This allows a sample to be rotated in the x-ray beam with the volumetric region of interest maintained in the x-ray beam so that later tomographic reconstruction can possibly be performed with minimal or even without additional alignment procedures for the projections.

SUMMARY OF THE INVENTION

One sample rotation system can provide sample rotation axis control up to the levels of precision required for x-ray microscopy applications. This sample rotation system utilizes a set of actuators and sensors that continuously sense and then adjust the rotation stage: 1) for translation in an x-axis direction, 2) for translation in a y-axis direction, and 3) for both angular motion (pitch and yaw) for z-axis corrections. With the selection of highly precise and accurate sensors and actuators, a precision of tens of nanometers and better is possible. This alignment system effectively provides the 3-dimensional rotation motion with high precision.

In addition to controlled motion, it is also important to be able to center the sample's region of interest on the axis of rotation of the sample rotation system. Since sensors and actuators of the sample rotation system have a limited range of detection and of motion, initial alignment is preferred and often required.

The present invention has application to translational motion for the sample on a rotation stage for accurate sample placement such as during an initial alignment procedure on a sample rotation system, in one embodiment.

Precision rotation requires calibration and correction of the rotating stage assembly, to ensure it produces a pure rotation motion that does not introduce translational error such as run-out or wobble. To accomplish this, it is often necessary to initially center the sample with sufficient accuracy to measure and compensate for the resulting translational errors during rotation.

In one particular embodiment, the purpose of the alignment assembly is to center a sample's region of interest on the true or nominal axis of rotation of a rotation stage, which is pre-aligned to the center of a field of view of an imaging system, such as a x-ray transmission imaging instrument as used in generating projections for CT applications.

A number of requirements are often common to sample alignment assemblies: a) dynamic stability for which a compact structure (low mass, high stiffness) keeps the resonant frequency of the rotary stage assembly high; b) thermal stability in which a simple and compact structure ensures a short thermal loop, the actuator is preferably decoupled after alignment, the stage structures are made of a material with low thermal expansion coefficient materials, such as Invar (FeNi); and c) Position maintaining stability in which the position of the assembly is maintained during operation such as by magnetic/friction forces and in which a simple mechanism with minimum numbers of contact surfaces reduces the parasitic motion due to residual contact strain release. These characteristics contrast with traditional alignment assemblies that have large and heavy bearing stages with complex cable arrangements.

This invention pertains to a sample alignment assembly for positioning a sample's volumetric region of interest within a field of view of an imaging system and preferably at a rotation stage's rotation axis. The mechanism includes a system of linear slides mounted above the rotation stage and actuator assembly that is mounted below the rotation stage (and therefore does not rotate with the slides), in one example. To make a position adjustment, the rotation stage rotates the slides relative the actuator in order to select the axis and direction. The alignment action is then made by a pushing motion by the actuator. The slides are magnetically preloaded, in one example, to maintain their position after the adjustment.

In general, according to one aspect, the invention comprises: a stage with a mechanism for performing rotation about its center, and an alignment assembly. The alignment assembly comprises a bottom slide residing on the rotation stage, a top slide residing on the bottom slide, a sample on a sample assembly residing on the top slide, and at least one actuator for selectively moving either slide, where the actuator, or actuators are physically separate from the slides, and the stage moves to align the slides with the actuator(s) for alignment.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

High-precision alignment or positioning is required in many applications including imaging, such as 3D imaging with CT, projection imaging, and reflectance/fluorescence imaging. In the example of 3D imaging, one must also be able to center a sample's region of interest accurately on the nominal rotation axis and the rotation error must be corrected to a level that is preferably smaller than the imaging resolution in order to avoid resolution loss, or producing artifacts during the 3D reconstruction.

Since the required range of sample movement in the initial alignment generally far exceeds the rotational error correction in a compensated rotating stage system, two additional, stacked stages, which move orthogonally to each other, are used between the sample and the rotation stage for initial sample positioning. This disclosure describes a compact system comprised of two linear slides with at least one actuator that is mounted off the stage on which the slides reside.

Figure 1:
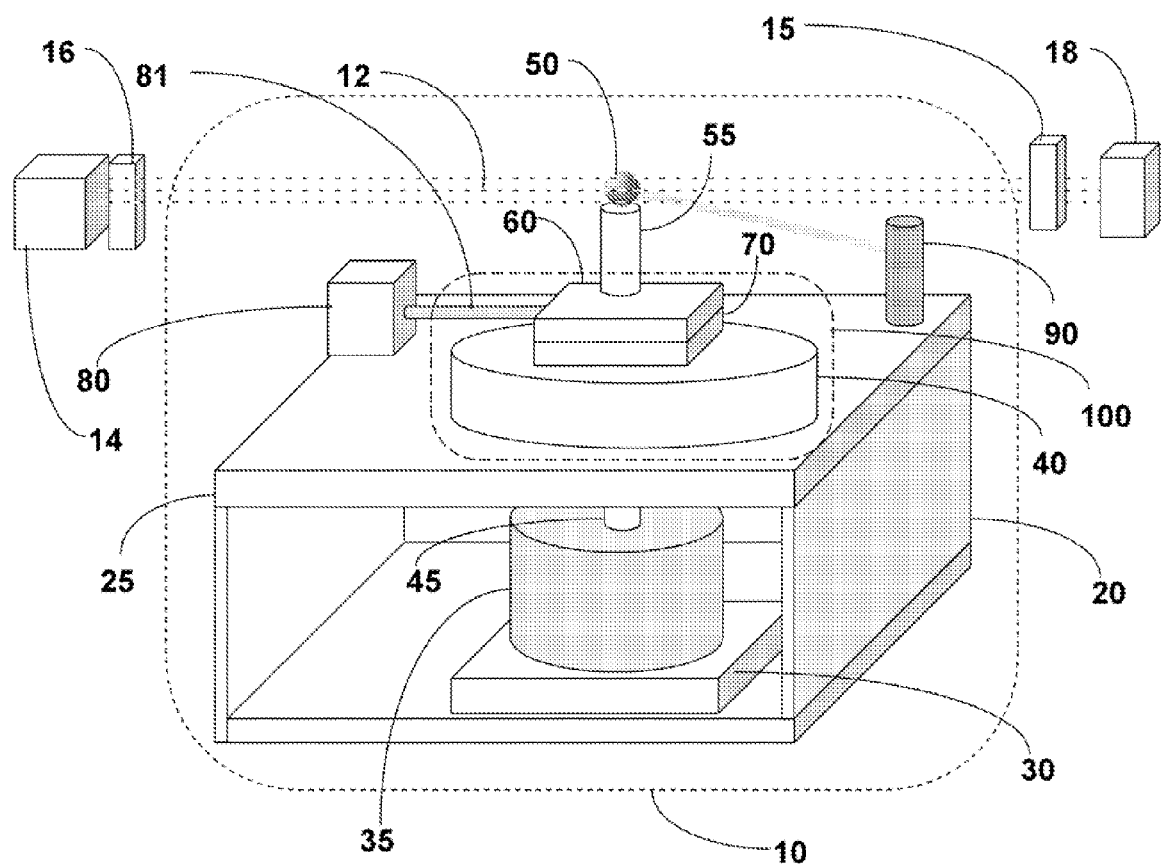
FIG. 1 is a simplified perspective view of a rotating stage system with an alignment assembly according to the present invention.

FIG. 1 shows a projection of a stage system 10 that has been constructed according to the principles of the present invention.

In more detail, the stage system 10 is comprised of: a reference frame 20, which functions as a mechanical ground, a motor stage 30, which supports a rotary motor 35 on the reference frame 20, and a drive shaft 45 of the rotary motor 35, which extends through a top plate 25 of the reference frame 20 and is connected to a rotation stage 40.

A sample assembly holds a sample 50 to be rotated on a sample holder or platform 55.

In one application, the stage system 10 holds the sample 50 within a radiation beam 12, such as an x-ray beam, generated by a radiation source 14, such as synchrotron or an electron bombardment x-ray source that is preferably paired with a condenser optic 16. The radiation 12 passing though the sample 50 is then, after being possibly focused by a lens 15 such as a zone plate lens, detected by a spatially resolved detector 18.

The sample assembly 55 is attached to the top of the alignment assembly 100, which comprises a rotation stage 40, a top linear slide 60, and bottom linear slide 70, both of which are aligned relative to the rotation stage 40.

In a current embodiment, the alignment of the top linear slide 60 and bottom linear slide 70 is performed by an actuator assembly 80 attached to the top plate 25 of the reference frame 20. In one implementation, an actuator arm 81 of the actuator assembly 80 is used to serially engage the top linear slide 60 and bottom linear slide 70 to effect alignment of the sample 50.

In one implementation, an optional external measurement device 90 is mounted on the top plate 25 of the reference frame 20. The measurement device 90 is used to measure the alignment and rotation of the sample 50. In one example, the measurement device 90 is an optical microscope.

Alternatively, or in addition, when deployed in an imaging system, the alignment can also be measured directly from the images acquired from the detector 18.

Note that in this illustration the rotation stage is placed horizontally. The system and method described here may also apply to rotation stages placed vertically or at any pitch angle.

In a preferred embodiment, the stage system 10 is a compensated rotating stage such as that disclosed in U.S. patent application Ser. No. 11/764,486, filed on Jun. 18, 2007, by Ying Xu, now U.S. Pat. No. 7,535,193, issued on May 19, 2009, which application is incorporated herein in its entirety by this reference. This compensated rotating stage uses a combination of five actuators placed in the motor stage 30 to move the motor, shaft and rotation stage according to measurements from six sensors placed between the top plate 25 of the reference frame 20 and the rotation stage 40 to thereby enable position compensation of the rotation stage during rotation with respect to the top plate of the reference frame in five axes during rotation.

Figure 5:
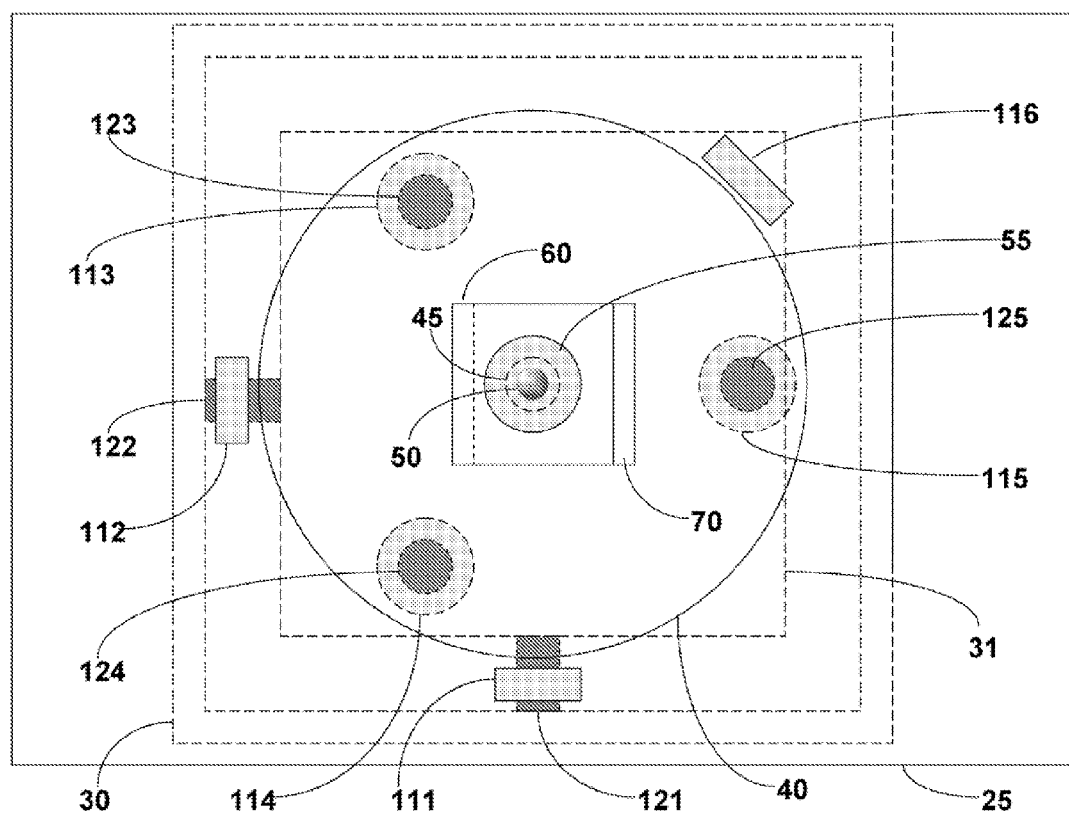
FIG. 5 is a top view schematic showing the placement of actuators and sensors for a five axis compensated rotating stage system with which the alignment is used in one embodiment.

FIG. 5 is a top view schematic of the placement of the actuators and sensors in a compensated version of the stage system 10. Three sensors 113, 114, and 115 measure the distance between the rotation stage 40 and the top plate of the reference frame 25. These sensors correspond to three actuators 123, 124, and 125, which adjust the placement of the base of the motor 31 with respect to the motor stage 30, to correct the height and angle of rotation (pitch and yaw) of the rotation stage 40. Two other sensors 111 and 112 measure the distance from fixed points on the top plate 25 of the reference frame 20 to the side of the rotation stage 40, in perpendicular directions. These sensors correspond to two actuators 121 and 122, which adjust the placement of the base of the motor 31 with respect to the motor stage 30, thereby adjusting the placement of the center of the rotation stage 40 in its plane of rotation. In this fashion, the sensors and actuators are used to perform high precision correction of the placement of the sample 50 during rotation, after the sample has been initially aligned using the alignment assembly. The placement of the five sensors and five actuators physically correspond to each other to minimize the cross-coupled corrections and corresponding computation. A sixth sensor 116 measures the distance between a fixed point on the top plate of the reference frame and the side of the rotation state, at a different angle than sensors 111 and 112. The sensor 116 may be used in conjunction with sensors 111 and 112 to pre-measure errors and compute corrections by angle for the curvature of the side of the rotation stage 40. At each angle of the rotation stage, these corrections may then be combined with the actual measurements of sensors 111 and 112 to apply the proper correction to actuators 121 and 122.

In a preferred implementation, the reference frame 20, rotation stage 40, alignment assembly 100, and sample platform 55 are all constructed out of material(s) with low coefficients of thermal expansion, to minimize any errors due to thermal expansion during operation.

Figure 2:
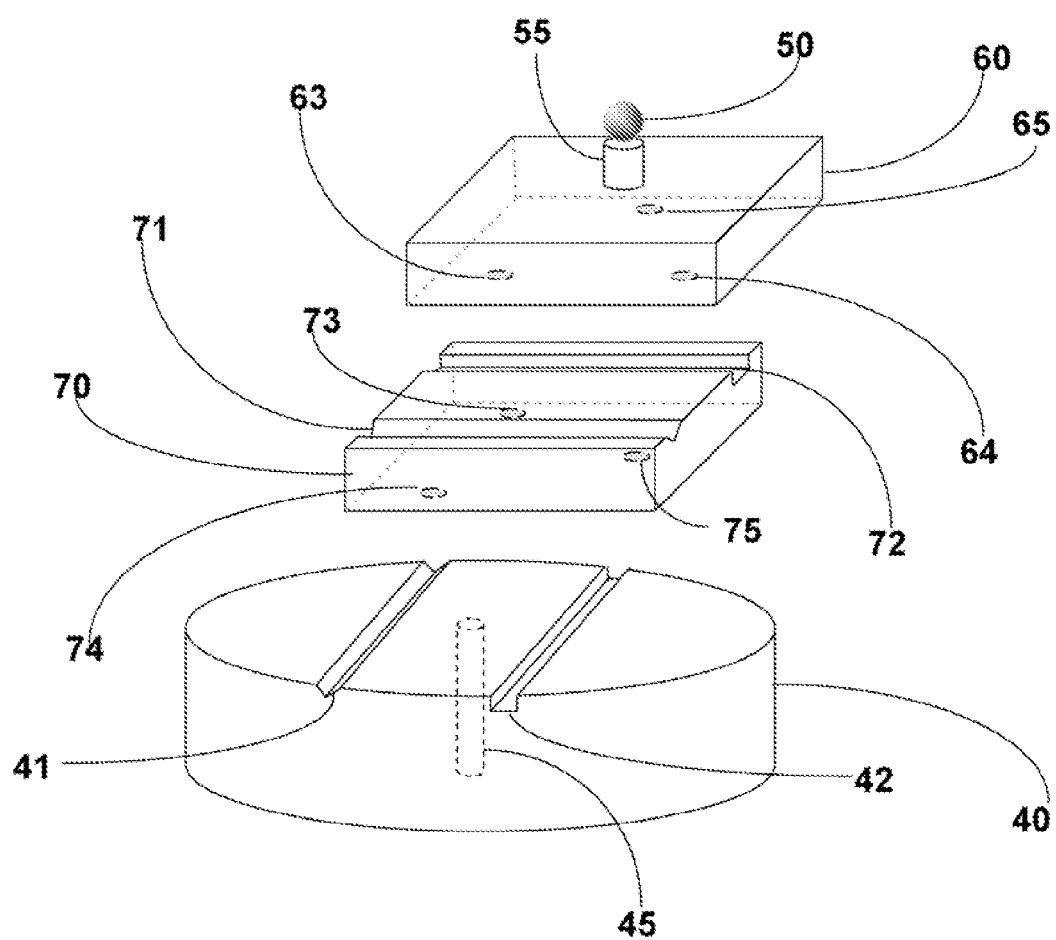
FIG. 2 is a simplified schematic exploded view of linear slides of the alignment assembly and the rotational stage.

FIG. 2 is a simplified diagram of the rotation stage 40, the top linear slide 60 and the bottom linear slide 70, of the alignment assembly 100. The top linear slide 60 rests on top of the bottom linear slide 70, which rests on top of the rotation stage 40. The rotation stage 40 is mounted on the motor drive shaft 45 about which it rotates.

The top of the rotation stage 40 has two grooves. A first one of the grooves 41 has a "V" shaped trench profile; and a second groove 42 has a rectangle profile forming a flat-bottom trench, in one embodiment.

Three contacts 73, 74, 75 project from a bottom face of the bottom linear slide 70. In one embodiment, the three contacts 73, 74, and 75 have male spherical profiles. Two of the contacts 73 and 74 are spaced and positioned on the bottom linear slide to fit or mate with the first V groove 41, and the third contact 75 fits or mates with the second flat groove 42 of the rotation stage 40. The combination of the spherical contacts 73, 74, 75 and the V groove 41 and flat groove 42 function to constrain movement of the bottom linear slide 70 to only move in a direction parallel to the grooves 41, 42. The two point contact between the side walls of the V groove 41 and the contacts 73, 74 constrain perpendicular movement. Contact between the bottom of the flat groove 42 and the contact 75 provides vertical support.

The bottom linear slide 70 is loaded against the rotation stage 40. In one embodiment, the loading force is provided by mass of the bottom linear slide 70 and the force of gravity. In other embodiments, a magnetic loading scheme is used in which the bottom linear slide 70 is constructed using a magnetic material and both the bottom linear slide 70 and the rotation stage 40 are constructed using a ferro-magnet material.

With loading provided by gravity or magnetically, this configuration of contacts 73, 74, 75 and the V groove 41 and flat groove 42 constrains the bottom linear slide 70 to move linearly along the parallel grooves 41 and 42 on the rotation stage 40.

The top of the bottom linear slide 70 also has a similar V-groove 71 and a flat-groove 72, which guide corresponding three spherical contacts 63, 64, and 65 projecting from the bottom of the top linear slide 60. The V groove 71 and flat groove 72, on top of the bottom linear slide 70, are perpendicularly aligned with contacts 73 and 74, to allow the top linear slide 60 to move in an orthogonal direction with respect to the movement of the bottom linear slide 70 on the rotation stage 40.

In the preferred embodiments, the spherical contacts 63, 64, 65, 73, 74, 75 are constructed out of a suitably hard substance such as tungsten carbide, ceramic, metal, or sapphire, that is cemented or press-fit into the corresponding bottom linear slide 70 and top linear slide 60. In one example, the spherical contacts are ball bearings.

In design, loading force must be sufficient to ensure the contact between the stages 60, 70 and generate sufficient friction force in ball-groove interface to maintain their aligned stage position with respect to each other while rotating. This is achieved through high mass and/or the inclusion of permanent, such as rare earth, magnets as spherical contacts 63, 64, 65, 73, 74, 75, with ferro-magnetic material in at least the rotation stage 40 and bottom linear slide 70.

Alignment is performed following the placement of the sample 50, which is either manually placed on the sample platform 55 or fixed to the sample platform 55 and the platform then manually attached to the top of the top linear slide 60.

Figures 3A, 3B, 3C:
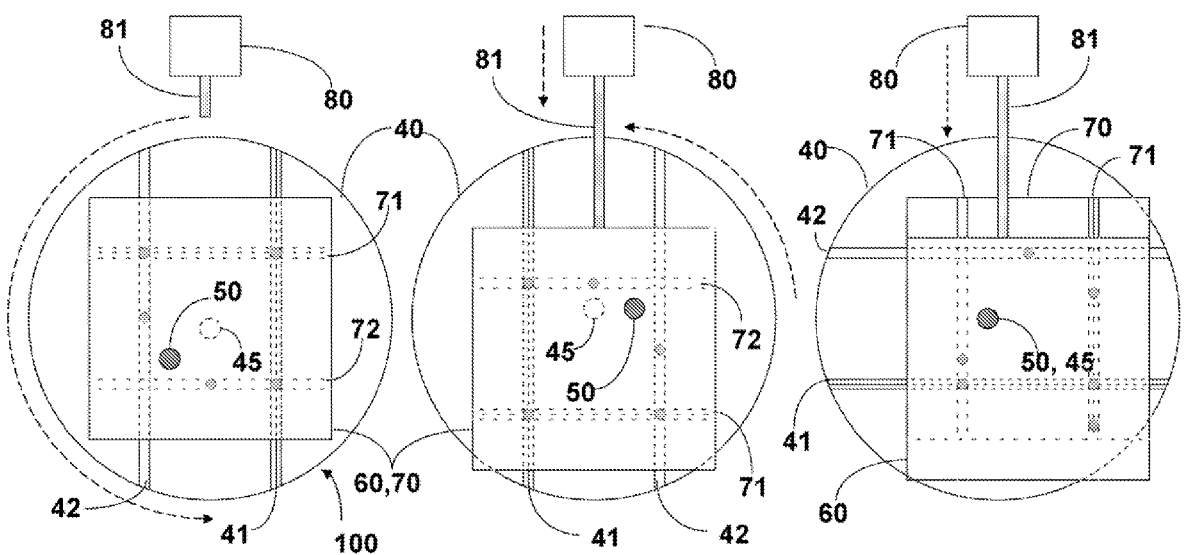
FIGS. 3a, 3b, and 3c are three top views of the rotational stage and the alignment assembly during an alignment procedure.

FIG. 3a is a top view showing the alignment assembly 100 following placement of the sample 50 and prior to alignment. The actuator assembly 80 has its arm 81 retracted. In this example, the external measurement device 90 or imaging system or an optical microscope associated with the imaging system determines that the location of the region of interest of the sample 50 is below and to the left of the center of the rotation stage 40. It is therefore necessary to then rotate the rotation stage 40, ½ circle or 180 degrees to begin the alignment. FIG. 3b is a top view of the alignment assembly 100 following the 180 degree rotation and extension of the actuator arm 81, which pushes both the top linear slide 60 and bottom linear slide 70, together, a sufficient amount to align the sample 50 to the center of the rotation stage 40 in one axis. The actuator arm 81 then retracts and the rotation stage is rotated 90 degrees. FIG. 3c is a top view of the alignment and rotation stage assemblies following the 90 degree rotation and extension of the actuator arm 81, which pushes only the top linear slide 60 a distance necessary to align the sample 50 with the center of the rotation stage 40, which is above the center of the motor shaft 45.

Only one actuator arm 81 pushing the top linear slide 60 is necessary. When the moving axis of the top linear slide 60 is aligned with the actuator arm 81 direction of extension, the top linear slide 60, which carries the sample 50, will move in a direction perpendicular to the axis of the bottom stage 70, which will remain fixed relative to the rotation stage 40 because the driving force of the actuator arm 81 is perpendicular to the rotation stage V groove 41 and spherical contacts 73 and 74 within the groove, which stops bottom linear slide 70 from moving in the direction of the driving force. When the moving axis of the bottom linear slide 70 is aligned with the actuator 81, the bottom linear slide 70 will carry both the top linear slide 60 and the sample 50 above it in the direction the bottom linear slide 70 is moving relative to the rotation stage 40. The top linear slide 60 will maintain its position unchanged relative to the bottom linear slide 70 because the driving force of the actuator arm 81 is perpendicular to the bottom linear slide V groove 71, which stops any motion along the driving direction.

The alignment procedure to center a region of interest on a sample in the rotation center of the rotation stage then includes the steps of: (a) rotating the rotation stage 40 until the one of the pairs of grooves is parallel to the movement of the alignment arm 81, (b) measuring the location of the sample 50, (c) successively rotating the rotation stage 90 degrees until the sample is closest to the actuator assembly as possible, (d) pushing the top linear slide 60 with the actuator arm 81 until the sample is the same distance from the actuator assembly as the center of rotation 45, and (e) repeat steps (c) and (d). A kinematic mount figure (3 V-Grooves) or reference edges (shoulders or recess) may be cut into the top of the top linear slide 60 to aid in the placement of the sample assembly on the top linear slide, and the alignment of the alignment assembly 100 to the actuator arm movement.

Prior to using alignment assembly 100 to align real samples, it may be necessary to align the external measurement device 90, which is usually an optical microscope with some measurement capability. This is accomplished by placing a test sample, a pin tip, small sphere, or other small object, on the sample stage 55, steering its region of interest towards rotation axis using the top and bottom linear slides with low power visual feedback. Then, after initially centering the external measurement equipment's image filed, the normal alignment procedure is performed, while successively centering the external measurement device's high magnification image field to the region of interest (the tip of the pin or center of the sphere). Alternatively, the centering measurement can be made direct with the imaging system, for example the CT detector used in the CT system. By rotating the sample and acquiring projection images at the same time, one may observe the linear shifts resulted from the rotation motion so that corrections can be readily made. This can often be done rapidly in real time.

It is contemplated that an additional linear slide may be integrated into the alignment assembly, which moves orthogonally to the first two linear slides, to also align vertically.

It is also contemplated that alignment assemblies may reside on non-rotating stages, and more than one actuator assembly may be used in the alignment process. In general the alignment assembly may be used wherever one or more actuators are able to access at least two sides of the alignment assembly.

Figure 4:
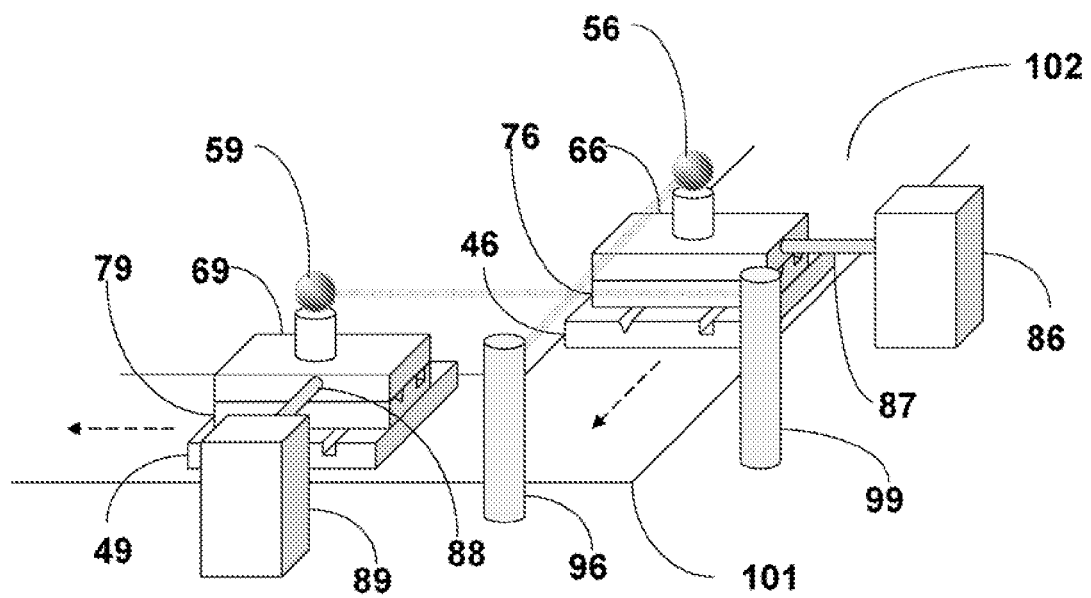
FIG. 4 is a schematic side view showing multiple alignment assemblies on multiple non-rotating stages moving between multiple actuator assemblies.

For example, in another embodiment of the present invention, multiple alignment assemblies, that reside on non-rotating stages, travel on a movable track and are aligned using multiple actuator assemblies and multiple external measurement devices. FIG. 4 shows a pair of linear slides 66, 76 and a stage 46, constructed in a fashion similar to the rotation stage 40, on a track 102, holding a sample 56, which is being aligned in one direction using an actuator assembly 86 and an external measurement device 99 to move the top linear slide 66. Simultaneously, down the track 100, after a corner 101, another pair of linear slides 69, 79 on another stage 49, holding another sample 59, are being aligned in another direction by another external measurement device 96 and another actuator assembly 89, which move both the top linear slide 69 and bottom linear slide 79. Each assembly moves successively from one alignment station to another, without changing rotational orientation. The alignment arms 87 and 88 include electromagnets that are energized upon contact with a linear slide to either push or pull the linear slide into alignment. The current is removed from the electromagnets arm following alignment to allow separation from the linear slide and retraction of the arm.

It is also contemplated to selectively electro-magnetize the actuator arm 81 by applying current to a coil of wire around the actuator arm's, near its tip, thereby allowing the actuator arm to either push or pull the linear slide(s) as needed to align them on the rotation stage 40. It is understood that at least the top linear slide must be constructed out of a ferro-magnetic material to ensure such motion.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for aligning a sample on an alignment assembly that resides on a rotation stage, to an axis of rotation of the rotation stage, using an actuator to move the alignment assembly, the alignment assembly comprising two orthogonal linear slides and an external measurement device to measure a location of the sample, the method comprising:
   (a) rotating the rotation stage until a direction of movement of the alignment assembly is parallel to the movement of the actuator,
   (b) measuring the location of the sample,
   (c) successively rotating the rotation stage 90 degrees until the sample is as closest to the actuator as possible,
   (d) pushing the at least one of the linear slides with the actuator until the sample is the same distance from the actuator as the center of rotation, and
   (e) repeating steps (c) and (d).

2. A method for aligning a sample on an alignment assembly that resides on a rotation stage, to an axis of rotation of the rotation stage, using an actuator to move the alignment assembly, the alignment assembly comprising two mutually orthogonal linear slides that are orthogonal to the axis of rotation of the rotation stage, the method comprising:
   rotating the rotation stage until a first direction of movement of the alignment assembly is parallel to movement of the actuator,
   measuring the location of the sample,
   positioning the sample relative to the axis of rotation of the rotation stage by the actuator moving the alignment assembly in the first direction,
   rotating the rotation stage until a second direction of movement of the alignment assembly is parallel to the movement of the actuator, and
   positioning the sample relative to the axis of rotation of the rotation stage by the actuator moving the alignment assembly in the second direction.

3. The method as claimed in claim 2, wherein the alignment assembly comprises a bottom linear slide on top of the rotation stage that is limited to move in the first direction and a top linear slide on top of the bottom linear slide which is limited to move in the second direction.

4. The method as claimed in claim 2, wherein the alignment assembly comprises a measurement device that is physically separate from the rotation stage for measuring a position of the sample.

5. The method as claimed in claim 2, wherein the actuator comprises at least one extending arm that engages the alignment assembly.

6. The method as claimed in claim 5, wherein the step of positioning the sample relative to the axis of rotation of the rotation stage by the actuator moving the alignment assembly comprises the actuator arm pushing on the alignment assembly.

7. The method as claimed in claim 2, wherein the orthogonal linear slides of the alignment assembly further comprise a top linear slide and a bottom linear slide that are magnetically loaded against each other to maintain their relative positions.

* * * * *